(12) United States Patent  
Park et al.

(10) Patent No.: US 8,513,740 B2  
(45) Date of Patent: Aug. 20, 2013

(54) COMPLEMENTARY METAL OXIDE SEMICONDUCTOR DEVICE HAVING METAL GATE STACK STRUCTURE AND METHOD OF MANUFACTURING THE SAME

(75) Inventors: Hong-bae Park, Seoul (KR); Sug-hun Hong, Yongin-si (KR); Sang-jin Hyun, Suwon-si (KR); Hoon-ju Na, Hwaseong-si (KR); Hye-lan Lee, Hwaseong-si (KR); Hyung-seok Hong, Ansan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 346 days.

(21) Appl. No.: 12/873,611

(22) Filed: Sep. 1, 2010

(65) Prior Publication Data

US 2011/0121399 A1 May 26, 2011

(30) Foreign Application Priority Data

Nov. 20, 2009 (KR) .................. 10-2009-0112810

(51) Int. Cl.  
*H01L 27/092* (2006.01)

(52) U.S. Cl.  
USPC .... 257/369; 257/407; 257/410; 257/E21.409; 257/E27.062

(58) Field of Classification Search  
USPC .............. 257/369, 213, 288, 412, E29.158, 257/E29.159, E29.16, E27.062  
See application file for complete search history.

(56) References Cited

U.S. PATENT DOCUMENTS

| | | | |
|---|---|---|---|
| 6,346,746 B1 * | 2/2002 | Agarwal | 257/751 |
| 7,126,199 B2 | 10/2006 | Doczy et al. | |
| 7,153,784 B2 | 12/2006 | Brask et al. | |
| 7,381,608 B2 | 6/2008 | Brask et al. | |
| 2004/0164362 A1 * | 8/2004 | Conley et al. | 257/407 |
| 2005/0156257 A1 * | 7/2005 | Bojarczuk et al. | 257/410 |
| 2006/0065939 A1 * | 3/2006 | Doczy et al. | 257/412 |
| 2008/0237700 A1 * | 10/2008 | Kim et al. | 257/326 |
| 2010/0052071 A1 * | 3/2010 | Niimi et al. | 257/369 |
| 2010/0327366 A1 * | 12/2010 | Manabe et al. | 257/369 |

FOREIGN PATENT DOCUMENTS

JP  2001-044423  2/2001

* cited by examiner

*Primary Examiner* — Minh-Loan T Tran  
*Assistant Examiner* — Fazli Erdem  
(74) *Attorney, Agent, or Firm* — Harness, Dickey & Pierce, P.L.C.

(57) ABSTRACT

A complementary metal oxide semiconductor (CMOS) device including: a semiconductor substrate including a NMOS region and a PMOS region; a NMOS metal gate stack structure on the NMOS region and including a first high dielectric layer, a first barrier metal gate on the first high dielectric layer and including a metal oxide nitride layer, and a first metal gate on the first barrier metal gate; and a PMOS metal gate stack structure on the PMOS region and including a second high dielectric layer, a second barrier metal gate on the second high dielectric layer and including a metal oxide nitride layer, and a second metal gate on the second barrier metal gate.

19 Claims, 9 Drawing Sheets

COMPLEMENTARY METAL OXIDE SEMICONDUCTOR DEVICE HAVING METAL GATE STACK STRUCTURE AND METHOD OF MANUFACTURING THE SAME

CROSS-REFERENCE TO RELATED APPLICATIONS

This application claims priority under 35 U.S.C. §119 to Korean Patent Application No. 10-2009-0112810, filed on Nov. 20, 2009, in the Korean Intellectual Property Office, the disclosure of which is incorporated herein in its entirety by reference.

BACKGROUND

Example embodiments of the inventive concept relate to a semiconductor device, and particularly, to a complementary metal oxide semiconductor (CMOS) device having a metal gate stack structure.

Generally, a gate stack structure of a metal oxide semiconductor (MOS) device includes a gate insulating layer formed on a semiconductor substrate and a gate formed on the gate insulating layer. Conventionally, a silicon oxide layer is used as the gate insulating layer, and a polysilicon layer is used as the gate.

As the size of the MOS device is decreased, the thickness of the gate insulating layer is reduced, and a line width of the gate is also gradually reduced. It is difficult to reduce the thickness of the gate insulating layer further due to physical limitation(s), and as the thickness of the gate insulating layer is reduced, a leakage current increases. As a result depletion occurs at an interface between the polysilicon silicon layer and the gate insulating layer, and the characteristic of the MOS device is deteriorated. Also, it is difficult to reduce a threshold voltage in a MOS device in which the silicon oxide layer is used as the gate insulating layer and the polysilicon layer is used as the gate.

As such, for higher/improved performance, the material and structure of the gate insulating layer and the gate of the gate stack structure needs to be changed. Furthermore, a complementary MOS (CMOS) device includes a NMOS (N-channel MOS) device and a PMOS (P-channel MOS) device. Thus, the material and structure of the gate stack structure of each of the NMOS device and the PMOS device also need to be changed.

SUMMARY

According to an example embodiment of the invention concepts, a complementary metal oxide semiconductor (CMOS) device includes a semiconductor substrate including a NMOS region and a PMOS region; a NMOS metal gate stack structure in the NMOS region, the NMOS metal gate stack structure including a first high dielectric layer, a first barrier metal gate on the first high dielectric layer, and a first metal gate on the first barrier metal gate, the first barrier metal gate including a first metal oxide nitride layer; and a PMOS metal gate stack structure on the PMOS region, the PMOS metal gate stack structure including a second high dielectric layer, a second barrier metal gate on the second high dielectric layer, and a second metal gate on the second barrier metal gate, the second barrier metal including a second metal oxide nitride layer.

According to an example embodiment of the invention concepts, the first metal oxide nitride layer includes a metal carbide oxide nitride layer, a metal silicide oxide nitride layer or a metal aluminum oxide nitride layer, and the second metal oxide nitride layer includes a metal carbide oxide nitride layer, a metal silicide oxide nitride layer or a metal aluminum oxide nitride layer.

According to an example embodiment of the invention concepts, the NMOS metal gate stack structure further includes a first metal interconnection layer on the first metal gate.

According to an example embodiment of the invention concepts, the PMOS metal gate stack structure further includes a second metal interconnection layer on the second metal gate.

According to an example embodiment of the invention concepts, the first barrier metal gate includes a lower barrier metal gate on the first high dielectric layer and an upper barrier metal gate on the lower barrier metal gate.

According to an example embodiment of the invention concepts, the upper barrier metal gate includes the first metal oxide nitride layer.

According to an example embodiment of the invention concepts, the second barrier metal gate includes a lower barrier metal gate on the second high dielectric layer and an upper barrier metal gate on the lower barrier metal gate.

According to an example embodiment of the invention concepts, the upper barrier metal gate includes the second metal oxide nitride layer.

According to an example embodiment of the invention concepts, the first metal gate and the second metal gate include different materials.

According to an example embodiment of the invention concepts, the first and second metal oxide nitride layers include a same material.

According to an example embodiment of the invention concepts, the first and second metal oxide nitride layers include different materials.

According to an example embodiment of the invention concepts, a complementary metal oxide semiconductor (CMOS) device includes a semiconductor substrate including a NMOS region and a PMOS region; a NMOS metal gate stack structure in the NMOS region, the NMOS metal gate stack structure including a first high dielectric layer, a first barrier metal gate and a first metal gate, the first barrier metal gate including a first metal oxide nitride layer; and a PMOS metal gate stack structure in the PMOS region, the PMOS metal gate stack structure including a second high dielectric layer, a second barrier metal gate, a second metal gate, and a third metal gate including a third metal oxide nitride layer, the second barrier metal gate including a second metal oxide nitride layer.

According to an example embodiment of the invention concepts, the first, second and third metal oxide nitride layers include a metal carbide oxide nitride layer, a metal silicide oxide nitride layer or a metal aluminum oxide nitride layer.

According to an example embodiment of the invention concepts, the first barrier metal gate includes a lower barrier metal gate on the first high dielectric layer, the lower barrier metal gate including a metal nitride layer, a metal silicon nitride layer or a metal aluminum nitride layer.

According to an example embodiment of the invention concepts, the second barrier metal gate includes a lower barrier metal gate on the second high dielectric layer, the lower barrier metal gate including a metal nitride layer, a metal silicon nitride layer or a metal aluminum nitride layer.

According to an example embodiment of the invention concepts, the PMOS metal gate stack structure further includes a first metal interconnection layer on the third metal gate.

According to an example embodiment of the invention concepts, the third metal oxide nitride layer of the third metal gate and the second metal oxide nitride layer of the second barrier metal gate are a same material.

According to an example embodiment of the invention concepts, a complementary metal oxide semiconductor (CMOS) device includes a semiconductor substrate including a NMOS region and a PMOS region; an insulating layer including a first trench and a second trench, the first and second trenches exposing the NMOS region and the PMOS region, respectively; a NMOS metal gate stack structure including a first high dielectric layer in the first trench, a first barrier metal gate on the first high dielectric layer, and a first metal gate on the first barrier metal gate, the first barrier metal gate including a first metal oxide nitride layer; and a PMOS metal gate stack structure including a second high dielectric layer in the second trench, a second barrier metal gate on the second high dielectric layer, a second metal gate on the second barrier metal gate, and a third metal gate on the second metal gate, the second barrier metal gate and the third metal gate including a second metal oxide nitride layer.

According to an example embodiment of the invention concepts, the NMOS metal gate stack structure further includes a first metal interconnection layer on the first metal gate.

According to an example embodiment of the invention concepts, the first metal interconnection layer is in the first trench and fills the first trench.

According to an example embodiment of the invention concepts, the PMOS metal gate stack structure further includes a second metal interconnection layer on the third metal gate.

According to an example embodiment of the invention concepts, the PMOS metal gate stack structure further includes a first metal interconnection layer on the third metal gate.

According to an example embodiment of the invention concepts, the first metal interconnection layer is in the second trench and fills the second trench.

According to an example embodiment of the invention concepts, the first barrier metal gate includes a first lower barrier metal gate on the first high dielectric layer and a first upper barrier metal gate on the first lower barrier metal gate, and the first trench exposes the first lower barrier metal gate.

According to an example embodiment of the invention concepts, the second barrier metal gate includes a second lower barrier metal gate on the second high dielectric layer and a second upper barrier metal gate on the second lower barrier metal gate, and the second trench exposes the second lower barrier metal gate.

According to an example embodiment of the invention concepts, the second barrier metal gate includes a lower barrier metal gate on the second high dielectric layer and an upper barrier metal gate on the lower barrier metal gate, and the second trench exposes the lower barrier metal gate.

According to an example embodiment of the invention concepts, a method of manufacturing a complementary metal oxide semiconductor device (CMOS) includes forming a high dielectric material layer on a semiconductor substrate including an NMOS region and a PMOS region; forming a barrier metal layer on the high dielectric material layer, the barrier metal layer including a metal oxide nitride; forming a metal gate material layer on the barrier metal layer; forming a NMOS metal gate stack structure in the NMOS region, the NMOS metal gate stack structure including the high dielectric material layer, the barrier metal layer and the metal gate material layer; and forming a PMOS metal gate stack structure in the PMOS region, the PMOS metal gate stack structure including the high dielectric material layer, the barrier metal layer and the metal gate material layer.

BRIEF DESCRIPTION OF THE DRAWINGS

The above and other features and advantages will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
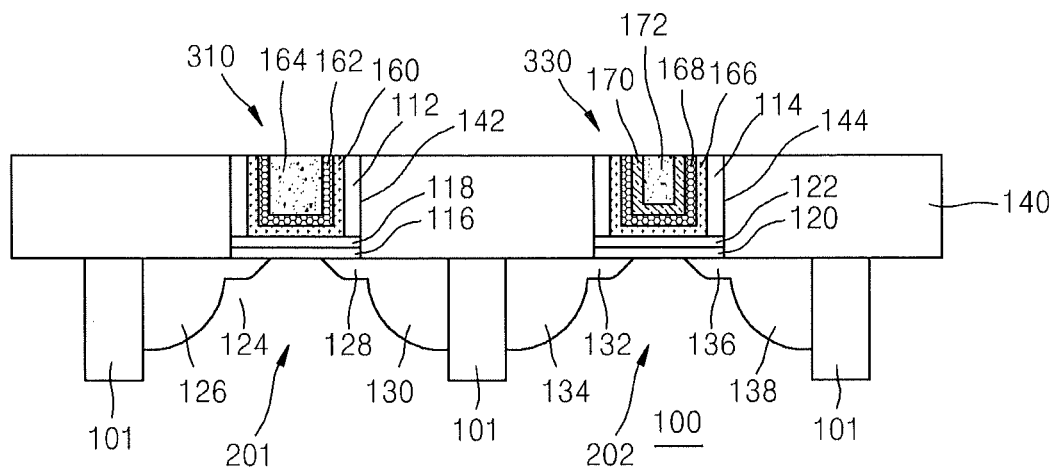
FIG. 1 is a cross-sectional view of a complementary metal oxide semiconductor (CMOS) device according to an example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

A complementary metal oxide semiconductor (CMOS) device according to an example embodiment includes a NMOS device and a PMOS device. The CMOS device may include a NMOS metal gate stack structure and a PMOS metal gate stack structure. The NMOS metal gate stack structure and the PMOS metal gate stack structure include a high dielectric layer as a gate insulating layer and a metal layer as a gate.

The NMOS metal gate stack structure and the PMOS metal gate stack structure may affect the characteristics (for example, a threshold voltage) of the CMOS device and may therefore be required to have an optimized material and an optimized structure. In other words, the NMOS metal gate stack structure and the PMOS metal gate stack structure need to have an optimized material and structure such that the characteristics of the CMOS device are not affected during the manufacture and/or operation of the CMOS device. An example embodiment of a CMOS device including the NMOS metal gate stack structure and the PMOS metal gate stack structure having the optimized material and structure will now be described.

Figure 2:
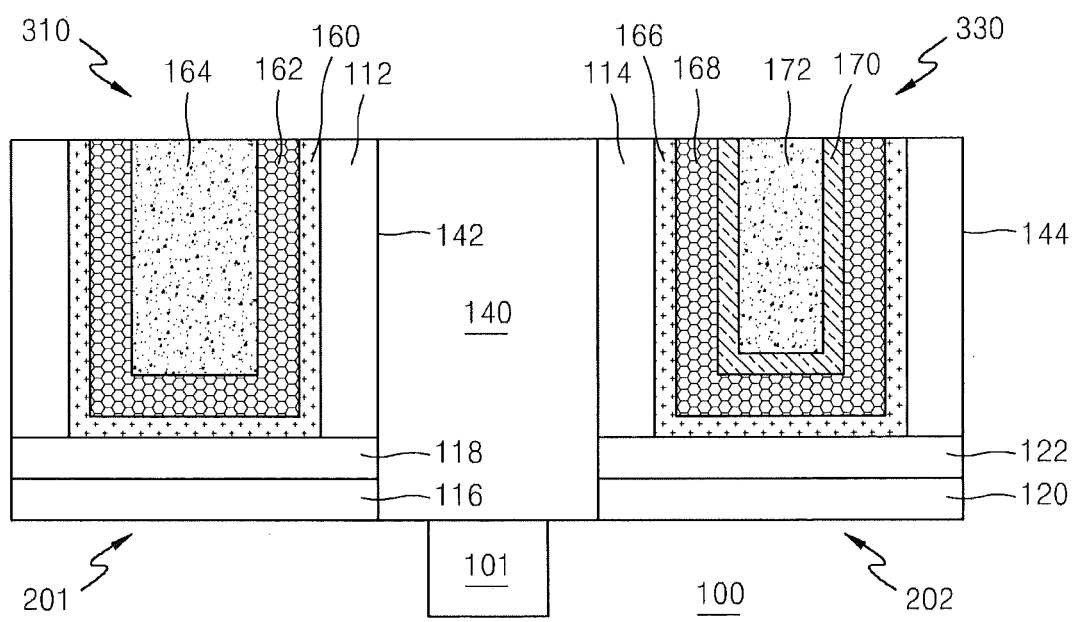
FIG. 2 is an enlarged cross-sectional view of a metal gate stack structure of the CMOS device of FIG. 1, according to example embodiments.

FIG. 1 is a cross-sectional view of the CMOS device according to an example embodiment, and FIG. 2 is an enlarged cross-sectional view of a metal gate stack structure of the CMOS device of FIG. 1, according to an example embodiment.

According to an example embodiment, the CMOS device includes a semiconductor substrate 100 including a NMOS region 201 and a PMOS region 202. The NMOS region 201 and the PMOS region 202 are separated by an isolation layer 101 from each other. The isolation layer 101 may be formed of a silicon oxide layer, for example. The semiconductor substrate 100 may be a silicon substrate, for example, a p-type silicon substrate.

The NMOS region 201 and the PMOS region 202 may include a NMOS metal gate stack structure 310 and a PMOS metal gate stack structure 330, respectively. The NMOS metal gate stack structure 310 may include a first high dielectric layer 116, a first lower barrier metal gate 118 and a first upper barrier metal gate 160, and a first metal gate 162 and a first metal interconnection layer 164. The first lower barrier metal gate 118 and the first upper barrier metal gate 160 may together constitute a first barrier metal gate.

The PMOS metal gate stack structure 330 may include a second high dielectric layer 120, a second lower barrier metal gate 122 and a second upper barrier metal gate 166, a second metal gate 168, a third metal gate 170, and a second metal interconnection layer 172. The second lower barrier metal gate 122 and the second upper barrier metal gate 166 may together constitute a second barrier metal gate.

The NMOS metal gate stack structure 310 and the PMOS metal gate stack structure 330 may be formed in a first trench 142 and a second trench 144, which are formed in an insulating layer 140. The first trench 142 and the second trench 144 expose the NMOS region 201 and the PMOS region 202, respectively. First and second spacers 112 and 114 may be formed on the inner walls of the first trench 142 and the second trench 144, respectively. Although, the first and second spacers 112 and 114 are shown as formed in the trenches 142 and 144 (FIG. 1), in another example embodiments of the CMOS device, the first and second spacers 112 and 114 may be absent.

Each of the first and second high dielectric layers 116 and 120 serves as a gate insulating layer. Each of the first and second high dielectric layers 116 and 120 has a dielectric constant that is greater than 10 and may have a dielectric constant that is between 15 and 25, for example. Each of the first and second high dielectric layers 116 and 120 may include at least one of the group consisting of hafnium oxide (HfO), hafnium silicon oxide (HfSiO), hafnium oxide nitride (HfON), hafnium silicon oxide nitride (HfSiON), lanthanum oxide (LaO), lanthanum aluminum oxide (LaAlO), zirconium oxide (ZrO), zirconium silicon oxide (ZrSiO), zirconium oxide nitride (ZrON), zirconium silicon oxide nitride (ZrSiON), tantalum oxide (TaO), titanium oxide (TiO), barium strontium titanium oxide (BaSrTiO), barium titanium oxide (BaTiO), strontium titanium oxide (SfTiO), yttrium oxide (YO), aluminum oxide (AlO), and a lead scandium tantalum oxide (PbScTaO). In the example embodiment of FIG. 1, each of the first and second high dielectric layers 116 and 120 may be a hafnium oxide (HfO) layer.

Each of the first and second lower barrier metal gates 118 and 122 is formed of metal that does not react with material layers that are subsequently formed, is resistant to high temperature and adheres to each of the first and second high dielectric layers 116 and 120 with relative ease. Also, each of the first and second lower barrier metal gates 118 and 122 serves as a barrier that prevents metal atoms from the first metal gate 162 and the second metal gate 168 or the first and second metal interconnection layers 164 and 172, for example, aluminum atoms, from spreading into the first and second high dielectric layers 116 and 120. Each of the first and second lower barrier metal gates 118 and 122 may be formed of a metal nitride layer, a metal oxide nitride layers, a metal silicon nitride layer or a metal aluminum nitride layer. In the example embodiment of FIG. 1, each of the first and second lower barrier metal gates 118 and 122 is formed of a titanium nitride (TiN) layer or a tantalum nitride (TaN) layer that is the metal nitride layer.

Each of the first and second upper barrier metal gates 160 and 166 may be formed of a metal oxide nitride layer. The metal oxide nitride layer forming each of the first and second upper barrier metal gates 160 and 166 is a metal nitride layer including oxygen. For example, the metal oxide nitride layer is a metal nitride layer such as a titanium nitride layer, a tungsten nitride layer, a tantalum nitride layer, a ruthenium nitride layer or a molybdenum nitride layer including oxygen. Also, the metal oxide nitride layer may include a metal carbide oxide nitride layer, a metal silicide oxide nitride layer or a metal aluminum oxide nitride layer.

In the example embodiment of FIG. 1, each of the first and second upper barrier metal gate 160 and 162 may be formed of a titanium oxide nitride (TiON) layer (titanium nitride layer including oxygen) or a tantalum oxide nitride (TaON) layer (tantalum nitride layer including oxygen).

Each of the first and second upper barrier metal gates 160 and 166 may serve as a barrier like the first and second lower barrier metal gates 118 and 122, as described above. In addition, each of the first upper barrier metal gate 160 and the second barrier metal gate 166 may respectively prevent etch damage of the first lower barrier metal gate 118 and/or the first high dielectric layer 116 and the second lower barrier metal gate 122 and/or the second high dielectric layer 120 during the manufacturing process of the CMOS device. The second upper barrier metal gate 166 increases a work function of the PMOS device as will be described later. The first upper barrier metal gate 160 is etched partially during the manufacturing process of the CMOS device and is formed of a thickness of about 10 to about 15 Å so as to serve as a barrier (as mentioned above) and/or prevent etch damage of the first high dielectric layer 116 and/or the first lower barrier metal gate 118 and thus does not affect a work function of the NMOS device.

The first metal gate 162 may determine the work function of the NMOS device and may have a work function between about 3.9 eV and about 4.2 eV. For example, the first metal gate 162 may include hafnium, zirconium, titanium, tantalum, aluminum or an alloy or metal carbide thereof. Metal carbide may be hafnium carbide, zirconium carbide, titanium carbide, tantalum carbide, aluminum carbide or the like. In the example embodiment of FIG. 1, the first metal gate 162 is formed of a titanium aluminum (TiAl) layer.

The second metal gate 168 may be formed of metal that is different from metal used to form the first metal gate 162, may determine the work function of the PMOS device and has a work function between about 4.9 eV and about 5.2 eV. The second metal gate 168 may be formed of ruthenium, palladium, platinum or a metal nitride layer such as a titanium nitride layer, a tungsten nitride layer, a tantalum nitride layer, a ruthenium nitride layer or a titanium aluminum nitride layer. In the example embodiment of FIG. 1, the second metal gate 168 is formed of a titanium nitride (TiN) layer.

The third metal gate 170 and the second upper barrier metal gate 166 may be formed of the same material. The third metal gate 170 plays a role somewhat similar to that of the second upper barrier metal gate 166 by serving as a barrier that prevents metal atoms of the second metal interconnection layer 172, for example, aluminum atoms, from spreading into the second high dielectric layer 120 and increases the work function of the PMOS device. In the example embodiment of FIG. 1, the third metal gate 170 is formed of a titanium oxide nitride layer.

The first and second metal interconnection layers 164 and 172 may be formed so that the first and second trenches 142 and 144 may be filled in the first and second metal interconnection layers 164 and 172. Each of the first and second metal interconnection layers 164 and 172 may be formed of a metal layer having good conductivity such as tungsten (W), aluminum (Al) or copper (Cu). In the example embodiment of FIG. 1, each of the first and second metal interconnection layers 164 and 172 are formed of an alloy layer of aluminum (Al) and titanium (Ti).

First impurity regions (for example, source regions) 124, 126, 132, and 134 and second impurity regions 128, 130, 136, and 138 (for example, drain regions) are formed in the semiconductor substrate 100. The first impurity regions 124 and 126 and the second impurity regions 128 and 130 may be, for example, n-type impurity regions, and the second impurity regions 132 and 134 and the second impurity regions 136 and 138 may be, for example, p-type impurity regions.

Figure 3:
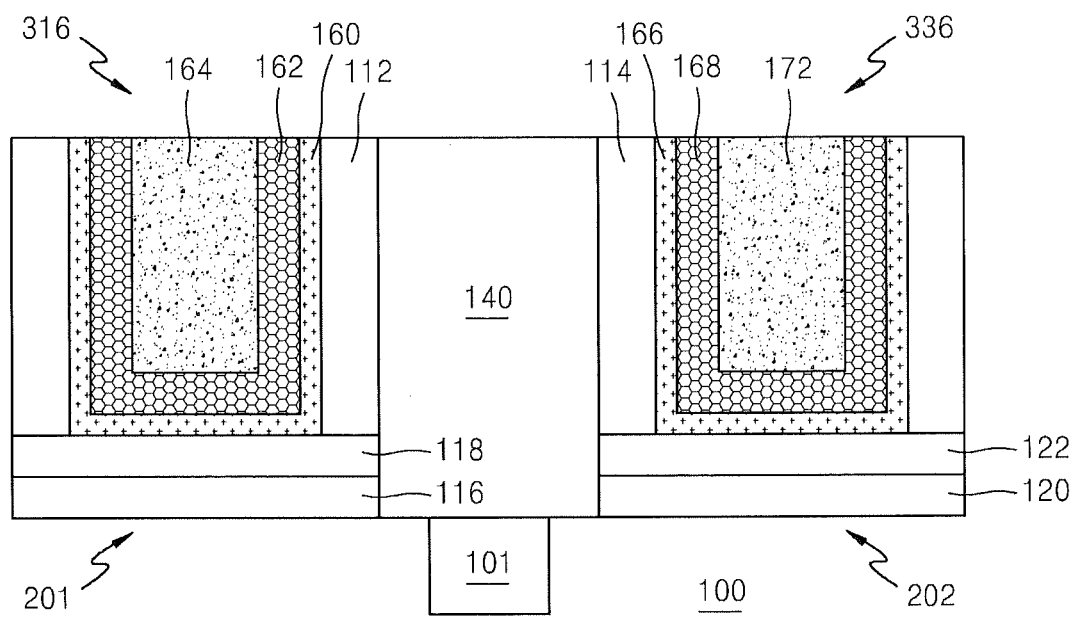
FIG. 3 is an enlarged cross-sectional view of a metal gate stack structure of a CMOS device, according to another example embodiment.

FIG. 3 is an enlarged cross-sectional view of a metal gate stack structure of a CMOS device according to another example embodiment. Referring to FIG. 3, metal gate stack structures 316 and 336 of the CMOS device are somewhat similar to the metal gate stack structures 310 and 330 of FIG. 2 except that a structure of the PMOS metal gate stack structure 336 of FIG. 3 is different from the PMOS metal gate stack structure 330 of FIG. 2. In other words, the PMOS metal gate stack structure 336 of the CMOS device of FIG. 3 is somewhat similar to the PMOS metal gate stack structure 330 of FIG. 2, except that the third metal gate 170 of FIG. 2 is not formed in the PMOS metal gate stack structure 336. Although the third metal gate 170 of FIG. 2 is not formed in the PMOS metal gate stack structure 336, a second upper barrier metal gate 166 may serve as a barrier that prevents a metal element used to form a second metal interconnection layer 172, for example, aluminum, from being spread into the second high dielectric layer 120 and may increase the work function of the PMOS device.

Hereinafter, a method of manufacturing the CMOS device of FIG. 1 will be described. However, as will be apparent to one of ordinary skill in the art, the method of manufacturing the CMOS device of FIG. 1 is not limited to the example embodiment below and the CMOS device of FIG. 1 may be manufactured by using various other methods.

Figure 4:
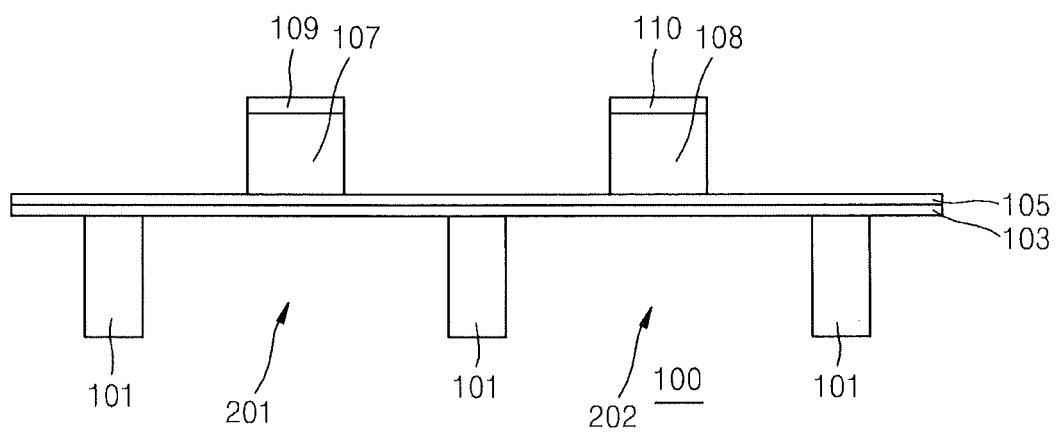
FIGS. 4 through 12 are cross-sectional views of a method of manufacturing the CMOS device of FIG. 1, according to an example embodiment.

FIGS. 4 through 12 are cross-sectional views illustrating a method of manufacturing the CMOS device of FIG. 1, according to example embodiments. Referring to FIG. 4, the semiconductor substrate 100 including the NMOS region 201 and the PMOS region 202 is prepared. The NMOS region 201 and the PMOS region 202 may be limited/isolated by the isolation layer 101. The isolation layer 101 may be a silicon oxide layer, for example. The semiconductor substrate 100 may be a silicon substrate, for example, a p-type silicon substrate.

A high dielectric material layer 103 is formed on the semiconductor substrate 100. The high dielectric material layer 103 may be patterned later and may be a gate insulating layer. The high dielectric material layer 103 may include at least one of the group consisting of hafnium oxide (HfO), hafnium silicon oxide (HfSiO), hafnium oxide nitride (HfON), hafnium silicon oxide nitride (HfSiON), lanthanum oxide (LaO), lanthanum aluminum oxide (LaAlO), zirconium oxide (ZrO), zirconium silicon oxide (ZrSiO), zirconium oxide nitride (ZrON), zirconium silicon oxide nitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide AlO), and a lead scandium tantalum oxide (PbScTaO). In the present embodiment, the high dielectric material layer 103 is formed of a hafnium oxide (HfO) layer.

However, examples of the high dielectric material layer 103 are not limited to the examples above and the high dielectric material layer 103 may be formed of any material that reduces gate leakage. The high dielectric material layer 103 has a dielectric constant that is greater than 10 and may be have a dielectric constant that is between 15 and 25, for example. The high dielectric material layer 103 may be formed using chemical vapor deposition, low pressure chemical vapor deposition or physical chemical deposition or any other suitable method. The high dielectric material layer 103 has a thickness less than 60 Å and may have a thickness of 5 to 40 Å.

A lower barrier metal layer 105 is formed on the high dielectric material layer 103. The lower barrier metal layer 105 may be patterned later and may be a lower barrier metal gate. The lower barrier metal layer 105 is formed of metal that does not react with material layers to be subsequently formed, is resistant to high temperature and adheres to the high dielectric material layer 103 with relative ease. The lower barrier metal layer 105 may be a metal nitride layer, a metal oxide nitride layer, a metal silicon nitride layer or a metal aluminum nitride layer. According to an example embodiment, the lower barrier metal layer may be formed of titanium nitride (TiN) or tantalum nitride (TaN). According to an example embodiment, the high dielectric material layer 103 and the lower barrier metal layer 105 are formed on the entire surface of the semiconductor substrate 100 but may be formed in trenches to be formed later, if necessary.

Sacrifice patterns 107 and 108 and hard mask patterns 109 and 110 are formed on the lower barrier metal layer 105. Each of the sacrifice patterns 107 and 108 may be formed of a polysilicon layer and has a thickness of about 100 to 2000 Å or a thickness of 500 to 1600 Å, for example. Each of the hard mask patterns 109 and 110 may be formed of a silicon nitride layer and has a thickness of about 100 to 1000 Å or a thickness of 200 to 350 Å, for example. According to an example embodiment, a sacrifice layer (not shown) and a hard mask layer (not shown) are formed on the first barrier metal layer 105, and the hard mask patterns 109 and 110 are formed by patterning the hard mask layer, and the sacrifice layer is etched by using the hard mask patterns 109 and 110, thereby forming the sacrifice patterns 107 and 108.

The sacrifice patterns 107 and 108 may include the first sacrifice pattern 107 of the NMOS region 201 and the second sacrifice pattern 108 of the PMOS region 202. The hard mask patterns 109 and 110 may include the first hard mask pattern 109 of the NMOS region 201 and the second hard mask pattern 110 of the PMOS region 202.

Figure 5:
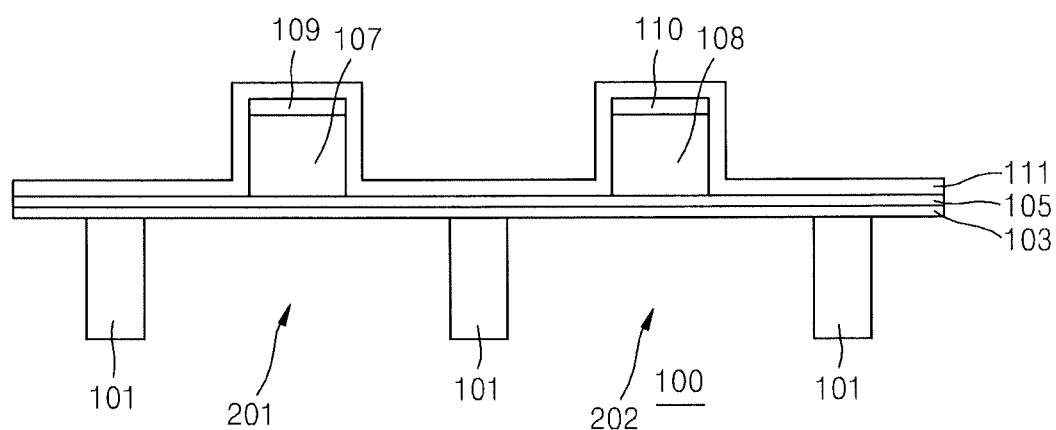

Referring to FIG. 5, a spacer insulating layer 111 is formed on the entire surface of the semiconductor substrate 100 on which the first and second sacrifice patterns 107 and 108, the hard mask patterns 109 and 110 and the lower barrier metal layer 105 are formed. The spacer insulating layer 111 may be formed of a silicon nitride layer, for example. The spacer insulating layer 111 may have a thickness less than about 1000 Å.

Figure 6:
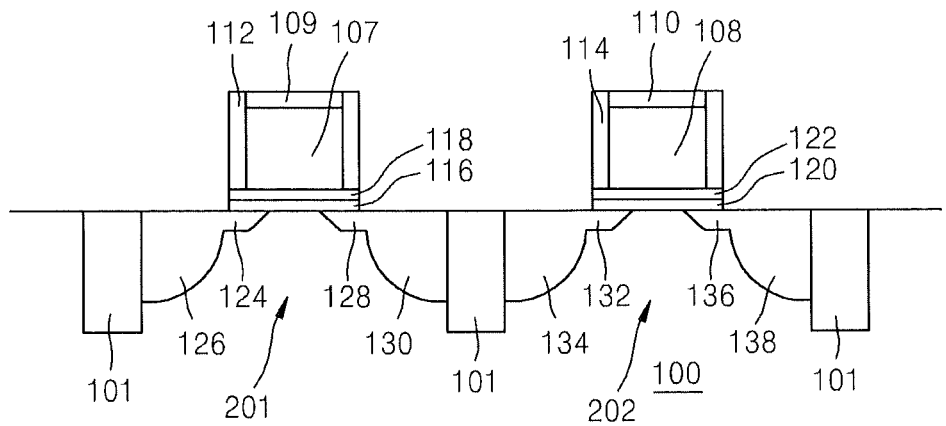

Referring to FIG. 6, the first and second spacers 112 and 114 are formed on sidewalls of the first and second sacrifice patterns 107 and 108 by etching (for example, selectively etching) the surface of the spacer insulating layer 111. The first and second sacrifice patterns 107 and 108 are surrounded by the spacers 112 and 114. The first and second spacers 112 and 114 may include the first spacer 112 of the NMOS region 201 and the second spacer 114 of the PMOS region 202. The first sacrifice pattern 107 of the NMOS region 201 is surrounded by the first spacer 112, and the second sacrifice pattern 108 of the PMOS region 202 is surrounded by the second spacer 114.

After the etching (for example, selective etching) of the surface of the spacer insulating layer 111, the lower barrier metal layer 105 and the high dielectric material layer 103 are etched, thereby forming the first and second lower barrier metal gates 118 and 122 and the first and second high dielectric layers 116 and 120 below the first and second sacrifice patterns 107 and 108. The first and second lower barrier metal gates 118 and 122 may include the first lower barrier metal gate 118 of the NMOS region 201 and the second lower barrier metal gate 122 of the PMOS region 202. The high dielectric layers 116 and 120 may include the first high dielectric layer 116 of the NMOS region 201 and the second high dielectric layer 120 of the PMOS region 202.

The first impurity regions 124, 126, 132, and 134 and the second impurity regions 128, 130, 136, and 138 are formed in the semiconductor substrate 100. The first impurity regions 124, 126, 132, and 134 may include first source regions 124 and 126 of the NMOS region 201 and second source regions 132 and 134 of the PMOS region 202. The second impurity regions 128, 130, 136, and 138 may include first drain regions 128 and 130 of the NMOS region 201 and second drain regions 136 and 138 of the PMOS region 202. The first source regions 124 and 126 and the first drain regions 128 and 130 may be n-type impurity regions, and the second source regions 132 and 134 and the second drain regions 136 and 138 may be p-type impurity regions.

The source regions 124 and 132 and the drain regions 128 and 136 are thinly doped regions of the semiconductor substrate 100 and are formed by implanting an impurity into the semiconductor substrate 100 and by annealing the semiconductor substrate 100 before the first and second spacers 112 and 114 are formed on the sidewalls of the first and second sacrifice patterns 107 and 108. The source regions 126 and 134 and the drain regions 130 and 138 are formed by implanting an impurity into the semiconductor substrate 100 and by annealing the semiconductor substrate 100 after the first and second spacers 112 and 114 are formed on the sidewalls of the first and second sacrifice patterns 107 and 108. The source regions 126 and 130 may be, for example, formed by using the stacked structure including the first high dielectric layer 116, the first lower barrier metal gate 118, the first sacrifice pattern 107, the first spacer 112 and the first hard mask pattern 109 as a mask and implanting n-type impurities in the NMOS region 201. Similarly, the drain regions 134 and 138 may, for example, be formed by using the stacked structure including the second high dielectric layer 120, the second lower barrier metal gate 122, the second sacrifice pattern 108, the second spacer 114 and the second hard mask pattern 110 as a mask and implanting p-type impurities in the PMOS region 202.

Figure 7:
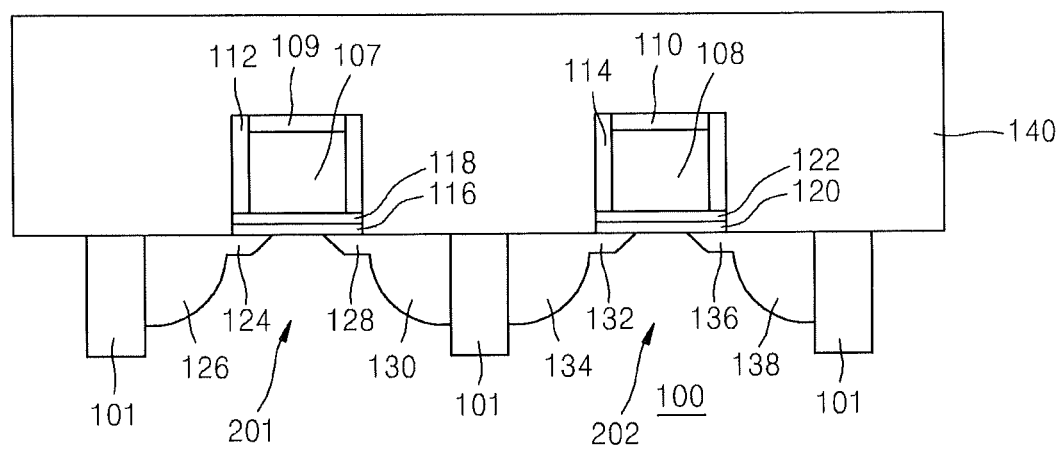

Referring to FIG. 7, the insulating layer 140 is formed on the entire surface of the semiconductor substrate 100 on which the first and second high dielectric layers 116 and 120, the first and second lower barrier metal gates 118 and 122, the first and second sacrifice patterns 107 and 108, the first and second spacers 112 and 114 and the first and second hard mask patterns 109 and 110 are formed. The insulating layer 140 is formed on the semiconductor substrate 100 to insulate a space between the stacked structure including the first high dielectric layer 116, the first lower barrier metal gate 118, the first sacrifice pattern 107 and the first spacer 112 are formed, and the stacked structure including the second high dielectric layer 120, the second lower barrier metal gate 122, the second sacrifice pattern 108 and the second spacer 114 are formed. The insulating layer 140 may be a silicon oxide layer, for example.

Figure 8:
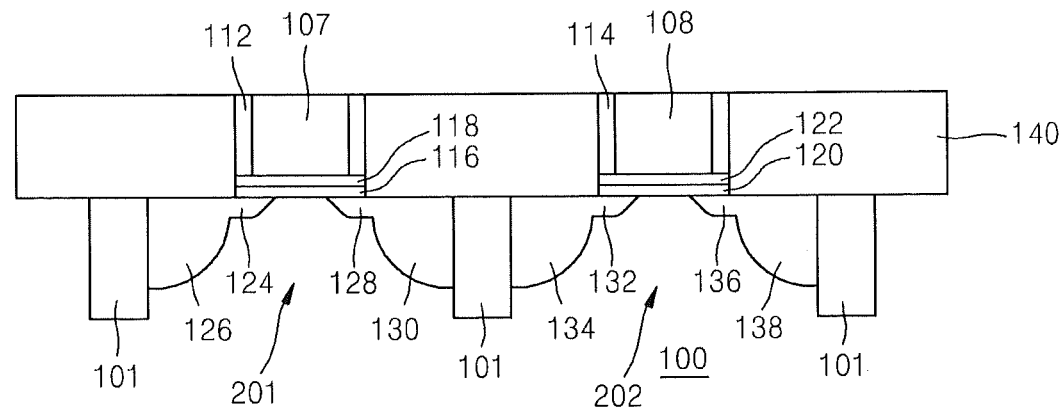

Referring to FIG. 8, the surfaces of the insulating layer 140 and the first and second hard mask patterns 109 and 110 are etched, thereby exposing the first and second sacrifice patterns 107 and 108. In other words, each of the first and second sacrifice patterns 107 and 108 is used as an etch stop point so that the insulating layer 140 and the first and second hard mask patterns 109 and 110 may be etched. The surfaces (for example, entire surface) of the insulating layer 140 and the first and second hard mask patterns 109 and 110 are etched, for example, by using chemical mechanical polishing (CMP).

Thus, the first and second hard mask patterns 109 and 110 are removed, and one-sided edges of the spacers 112 and 114 are also etched partially.

Figure 9:
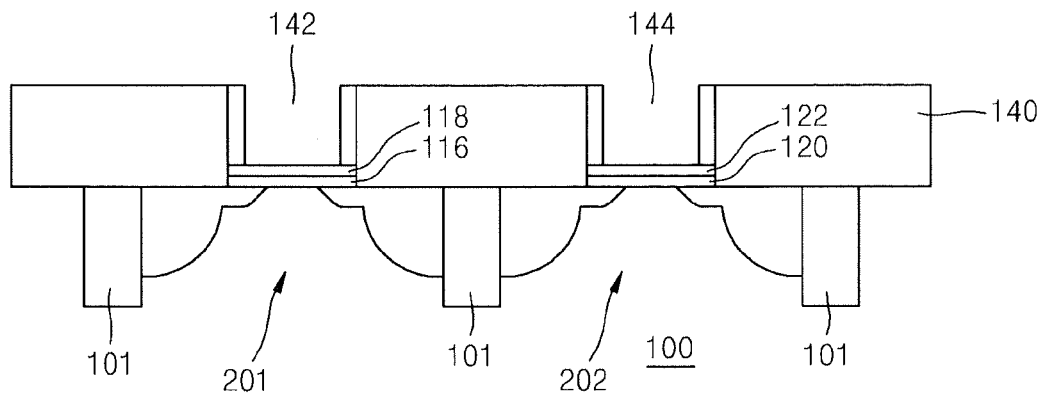

Referring to FIG. 9, either the first sacrifice pattern 107 or the second sacrifice pattern 108 is removed, thereby forming the first and second trenches 142 and 144. The first and second trenches 142 and 144 may include the first trench 142 of the NMOS region 201 and the second trench 144 of the PMOS region 202. In FIG. 9, the first and second trenches 142 and 144 expose the first and second lower barrier metal gates 118 and 122. In detail, the first trench 142 exposes the first lower barrier metal gate 118, and the second trench 144 exposes the second lower barrier metal gate 122. When the first and second sacrifice patterns 107 and 108 are removed, each of the first and second lower barrier metal gates 118 and 122 serves as a barrier that prevents etching of the first and second high dielectric layers 116 and 120.

According to an example embodiment, the first and second trenches 142 and 144 are formed after the first and second high dielectric layers 116 and 120 are formed. However, according to another example embodiment, after the first and second trenches 142 and 144 are formed, the first and second high dielectric layers 116 and 120 and the first and second lower barrier metal gates 118 and 122 may be formed. Accordingly, the first trench 142 may expose the NMOS region 201, e.g. the semiconductor substrate 100 or the first lower barrier metal gate 118, and the second trench 144 may expose the PMOS region 201, e.g. the semiconductor substrate 100 or the second lower barrier metal gate 122.

Figure 10:
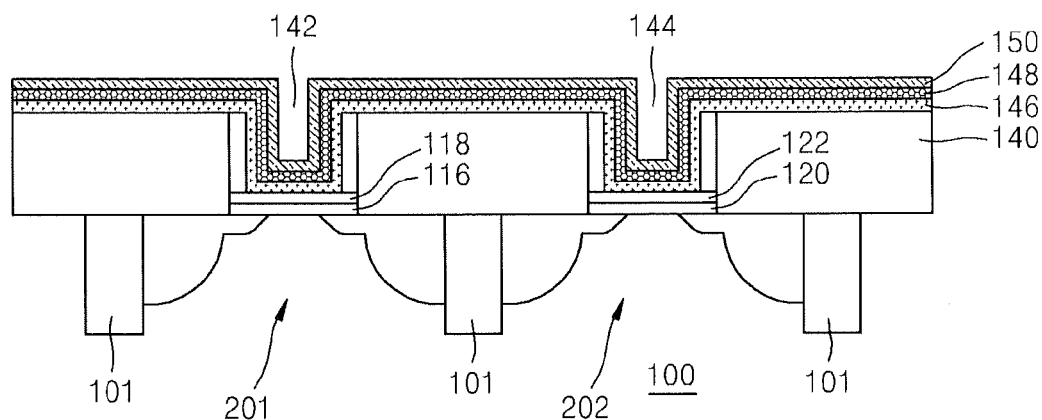

Referring to FIG. 10, an upper barrier metal layer 146, a first metal gate material layer 148, and a second metal gate material layer 150 are formed on the entire surface of the semiconductor substrate 100 in which the first and second trenches 142 and 144 are formed. The upper barrier metal layer 146 may later form an upper barrier metal gate and may be formed of a metal oxide nitride layer.

The metal oxide nitride layer that constitutes the upper barrier metal layer 146 includes a metal nitride layer containing oxygen. For example, the metal oxide nitride layer is a material layer in which oxygen is contained in a metal nitride layer such as a titanium nitride layer, a tungsten nitride layer, a tantalum nitride layer, a ruthenium nitride layer or a molybdenum nitride layer. Also, the metal oxide nitride layer 146 may include a metal carbide oxide nitride layer, a metal silicide oxide nitride layer or a metal aluminum oxide nitride layer. According to an example embodiment, the upper barrier metal layer 146 may include titanium oxide nitride (TiON) or tantalum oxide nitride (TaON) in which oxygen is contained in a titanium nitride layer or a tantalum nitride layer.

The first metal gate material layer 148 may later form a second metal gate of the PMOS region 202 and may be include of hafnium, zirconium, tantalum, aluminum, and/or metal carbide thereof. Metal carbide may include hafnium carbide, zirconium carbide, titanium carbide, tantalum carbide, aluminum carbide or the like.

The second metal gate material layer 150 may form a third metal gate of the PMOS region 202 and may include the same material as material used to form the upper barrier metal layer 146. In other words, the second metal gate material layer 150 is formed using the metal oxide nitride layer.

Figure 11:
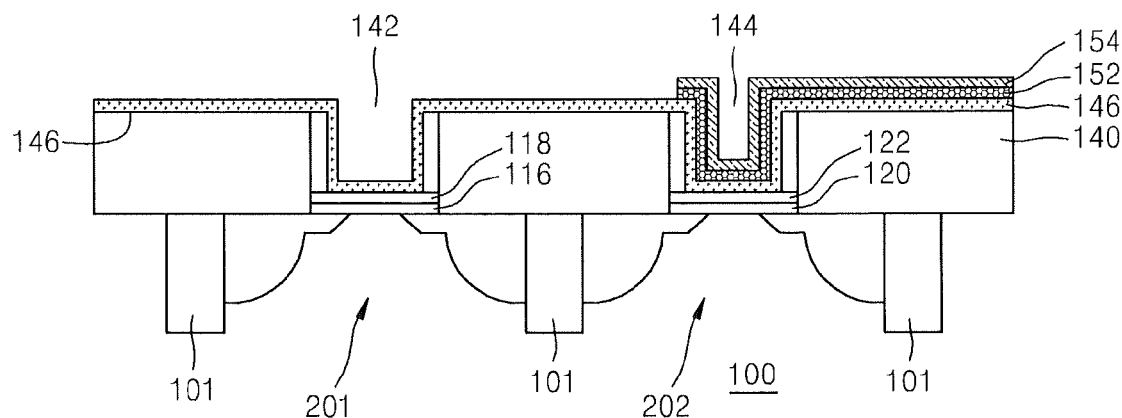

Referring to FIG. 11, the second metal gate material layer 150 and the first metal gate material layer 148 are patterned, thereby forming a second metal gate material pattern 154 and a first metal gate material pattern 152 in the PMOS region 202. In detail, the second metal gate material layer 150 and the first metal gate material layer 148 of the NMOS region 201 are etched, thereby exposing the upper barrier metal layer 146 of the NMOS region 201 and forming the second metal gate material pattern 154 and the first metal gate material pattern 152 in the PMOS region 202. When the second metal gate material layer 150 and the first metal gate material layer 148 of the NMOS region 201 are etched, the upper barrier metal layer 146 of the NMOS region 201 serves as an etch stopper.

Figure 12:
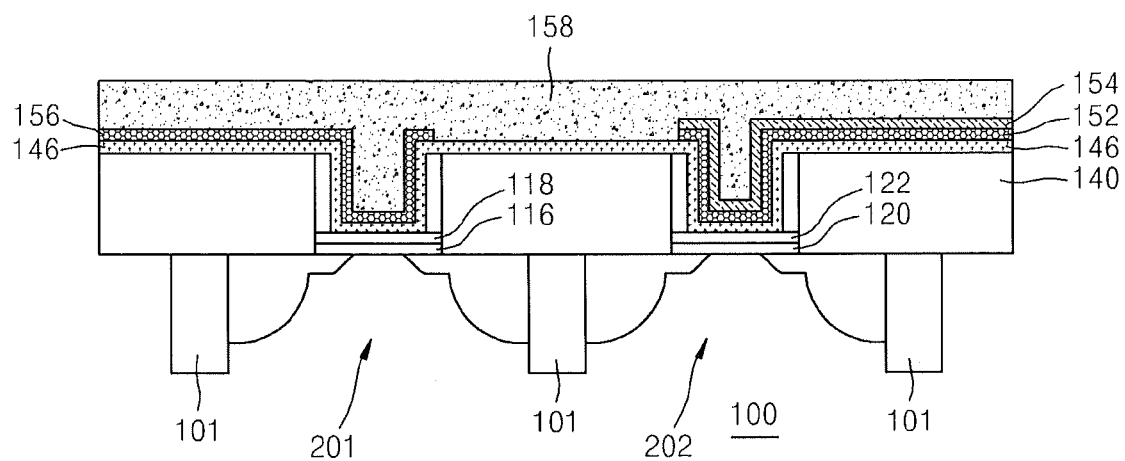

Referring to FIG. 12, a third metal gate material pattern 156 is formed on the NMOS region 201. In detail, the third metal gate material pattern 156 is formed on the upper barrier metal layer 146 of the NMOS region 201. The third metal gate material pattern 156 may later form a first metal gate of the NMOS region 201. The third metal gate material pattern 156 may include hafnium, zirconium, titanium, tantalum, aluminum or an alloy or metal carbide thereof. Metal carbide may be hafnium carbide, zirconium carbide, titanium carbide, tantalum carbide, aluminum carbide or the like. According to an example embodiment, the third metal gate material pattern 156 may include a titanium aluminum (TiAl) layer.

Subsequently, a metal interconnection material layer 158 is formed on the entire surface of the semiconductor substrate 100 so that the first and second trenches 142 and 144 may be filled with the metal interconnection material layer 158. The metal interconnection material layer 158 may include metal having good conductivity such as tungsten (W), aluminum (Al) or copper (Cu). According to an example embodiment, the metal interconnection material layer 158 may include an alloy of Al and Ti.

Referring to FIGS. 1 and 12, using the surface of the insulating layer 140 as an etch stop point, the entire surfaces of the metal interconnection material layer 158, the second metal gate material pattern 154, the first metal gate material pattern 152, the third metal gate material pattern 156, and the upper barrier metal layer 146 are etched. Entire surface etching is performed using CMP, for example.

Thus, the metal interconnection material layer 158 becomes the first and second metal interconnection layers 164 and 172 of the NMOS region 201 and the PMOS region 202 (FIG. 1). The third metal gate material pattern 156 becomes the first metal gate 162 of the NMOS region 201. The second metal gate material pattern 154 and the first metal gate material pattern 152 become the third metal gate 170 and the second metal gate 168 of the PMOS region 202, respectively. The upper barrier metal layer 146 becomes the first upper barrier metal gate 160 of the NMOS region 201 and the second upper barrier metal gate 166 of the PMOS region 202, respectively.

Figure 13:
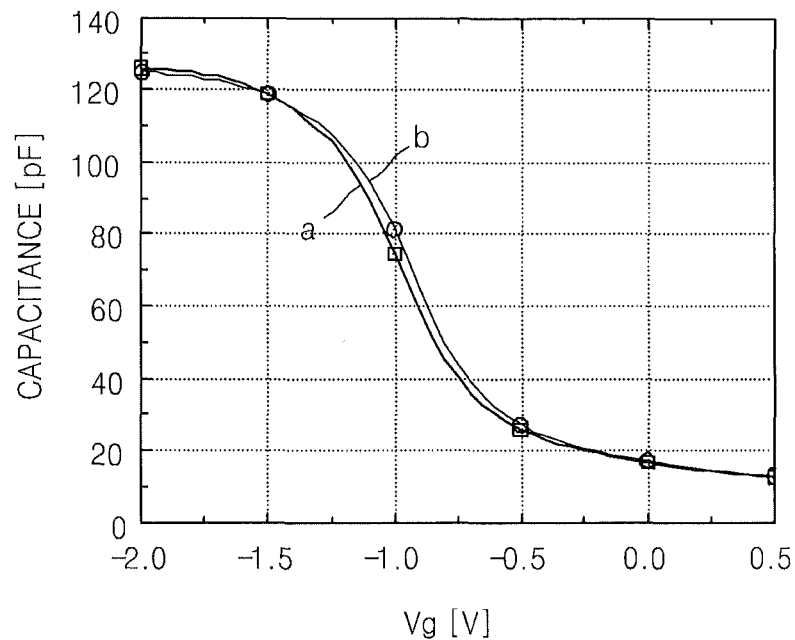
FIGS. 13 and 14 are graphs showing a change of work functions of a metal oxide nitride layer formed in a PMOS metal gate stack structure according to an example embodiment.
Figure 14:
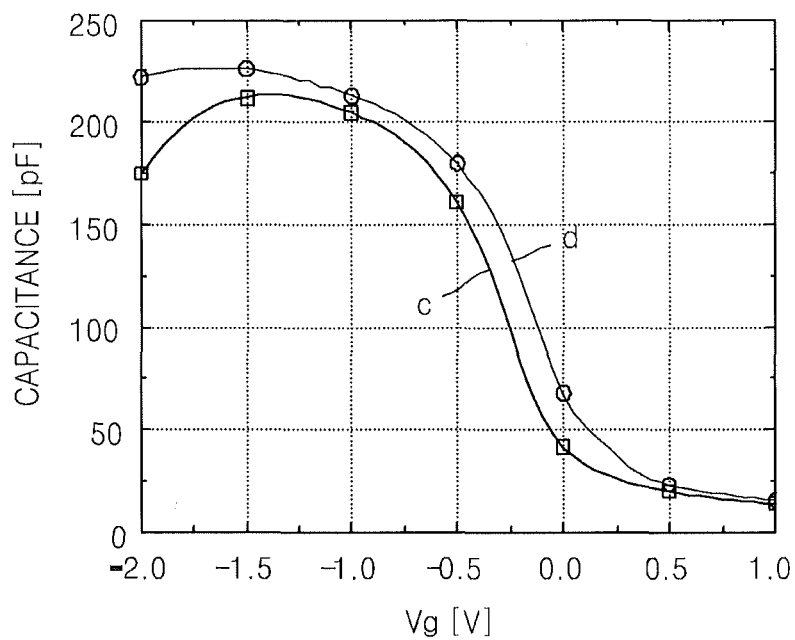

FIGS. 13 and 14 are graphs showing a change of work functions of a metal oxide nitride layer formed in a PMOS metal gate stack structure according to an example embodiment. In detail, FIG. 13 is a graph of capacitance versus voltage, wherein a PMOS metal gate stack (indicated by a) including a hafnium oxide layer and a titanium nitride layer and a PMOS metal gate stack (indicated by b) including the hafnium oxide layer and a titanium oxide nitride layer are used. The titanium oxide nitride layer is formed by forming a titanium layer on a high dielectric layer and by thermally treating the titanium layer in an ozone atmosphere. In other words, a barrier metal gate or a metal gate is fanned by adding oxygen to the titanium layer.

FIG. 14 is a graph of capacitance versus voltage, wherein the PMOS metal gate stack (indicated by c) including the hafnium oxide layer and a tantalum nitride layer and the PMOS metal gate stack (indicated by b) including the hafnium oxide layer and the tantalum oxide nitride layer are used. The tantalum oxide nitride layer is formed by forming a tantalum layer on the high dielectric layer and by thermally treating the tantalum layer in an ozone atmosphere. In other words, the barrier metal gate or the metal gate is formed by adding oxygen to the tantalum layer.

When oxygen is contained in the titanium oxide nitride layer or the tantalum oxide nitride layer that constitutes the barrier metal gate or the metal gate, a flat band voltage is increased, as indicated by b and d of FIGS. 13 and 14. When the flat band voltage is increased, a work function of the PMOS metal gate stack is increased. This is because the barrier metal gate or the metal gate prevents spreading of an element used to form a metal interconnection layer, e.g. aluminum and increases the work function of the PMOS metal gate stack. Also, when the barrier metal gate or the metal gate is formed of the titanium oxide nitride layer or the tantalum oxide nitride layer, oxygen vacancy that may occur in an interface between the high dielectric layer and the barrier metal gate in a subsequent process may be prevented.

Figure 15:
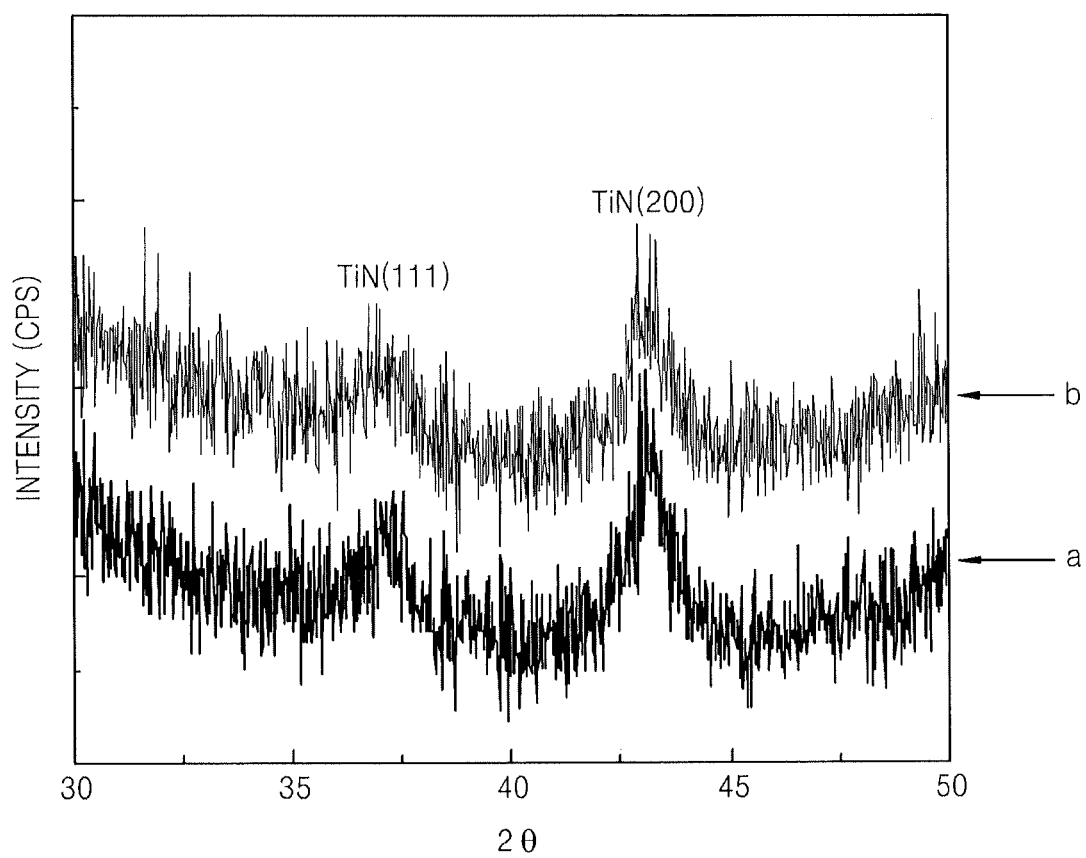
FIG. 15 is a graph showing the characteristic of a barrier metal gate of the metal gate stack structure of the CMOS device of FIG. 1, according to an example embodiment.

FIG. 15 is a graph showing the characteristic of a barrier metal gate of the metal gate stack structure of the CMOS device of FIG. 1. In detail, FIG. 15 is an X-ray graph for explaining the degree of crystallization of a metal oxide nitride layer that constitutes a barrier metal gate, according to an example embodiment. FIG. 15 is an X-ray graph showing a first sample (indicated by a) in which an oxide layer and a titanium nitride layer are formed on a semiconductor substrate and a second sample (indicated by b) in which an oxide layer, a titanium nitride layer and a titanium oxide nitride layer that is formed by oxygen plasma processing the titanium nitride layer are formed. A peak of the titanium nitride layer formed in the second sample b in which the titanium oxide nitride layer is formed, is lower than a peak of the titanium nitride layer formed in the first sample a in which the titanium nitride layer is formed. Thus, the degree of crystallization of the titanium oxide nitride layer is reduced compared to the degree of crystallization of the titanium nitride layer. In addition, the titanium nitride layer represents a columnar structure, and the titanium oxide nitride layer represents a granular structure. Thus, the titanium oxide nitride layer serves as an etch stopper and a barrier layer that prevents spreading of impurity.

Example devices including a CMOS device having the above structure are described below. However, example embodiments are not limited to the devices disclosed below.

Figure 16:
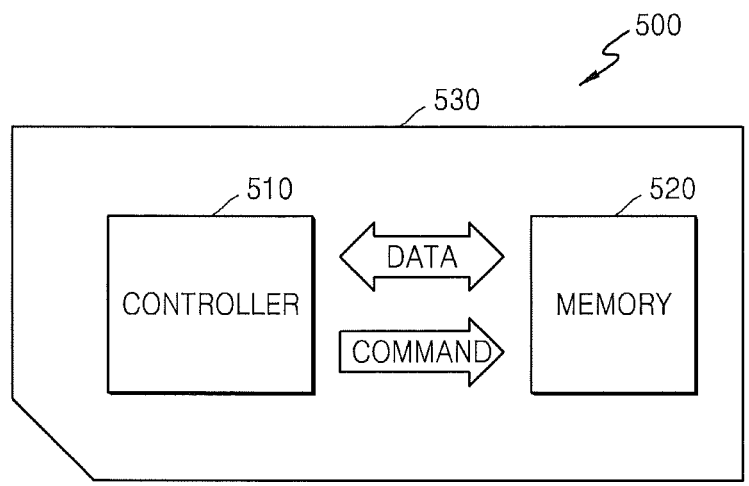
FIG. 16 is a schematic block diagram of a memory card according to an example embodiment.

FIG. 16 is a schematic block diagram of a memory card 500 according to an example embodiment. Referring to FIG. 16, the memory card 500 may include a controller 510 and a memory 520 (or a memory chip), which are embedded in a housing 530. The controller 510 and the memory 520 may transmit and receive an electrical signal to and from each other. For example, the memory 520 and the controller 510 may transmit and receive data to and from each other according to a command of the controller 510. Thus, the memory card 500 may store data in the memory 520 or may output data from the memory 120 to an external device.

For example, a portion, e.g. a peripheral circuit portion, of the memory 520 may include the above-described CMOS device. The memory card 500 may be used as a data storage medium of various mobile phones. For example, the memory card 500 may include a memory stick card, a smart media (SM) card, a secure digital (SD) card, a mini secure digital (SD) card, a multi media card (MMC) or the like.

Figure 17:
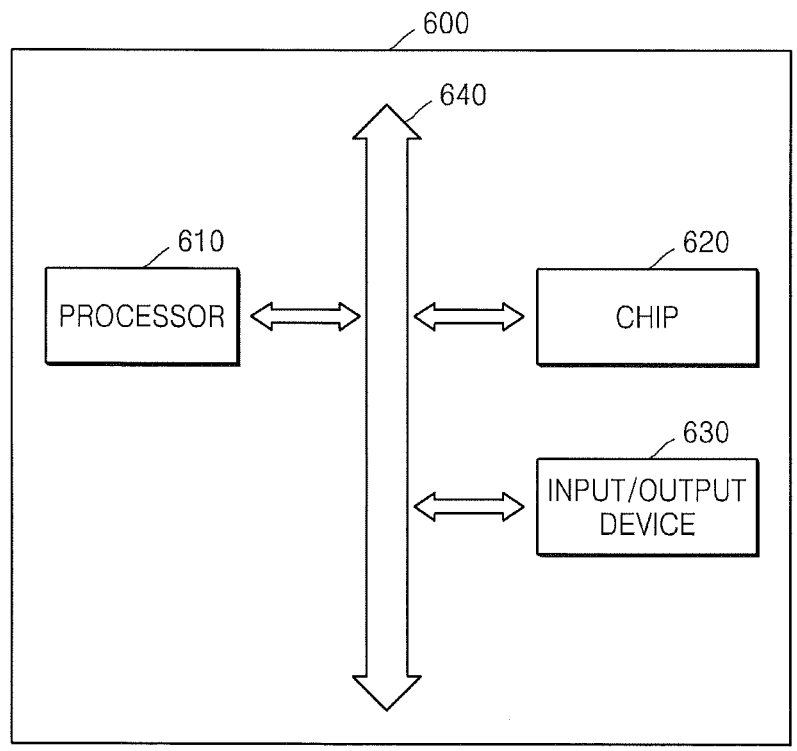
FIG. 17 is a block diagram of an electronic system according to an example embodiment.

FIG. 17 is a block diagram of an electronic system 600 according to an example embodiment. Referring to FIG. 17, the electronic system 600 may include a processor 610, an input/output device 630, and a chip 620, which data communicate with one another by using a bus 640. The processor 610 may execute a program and control the electronic system 600. The input/output device 630 may be used to input or output data of the electronic system 600. The electronic system 600 may be connected to an external device such as a personal computer (PC) or a network by using the input/output device 630 and may exchange data with the external device.

The chip 620 may store code and data for operating the processor 610 and perform a portion of the operations of the processor 610. For example, the chip 620 may include the above-described CMOS device. The electronic system 600 may constitute various electronic control devices that require the chip 620 and may be used in a mobile phone, a MP3 player, a navigation device, a solid state disc (SSD), a household appliance or the like.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A complementary metal oxide semiconductor (CMOS) device, comprising:
   a semiconductor substrate including a NMOS region and a PMOS region;
   a NMOS metal gate stack structure in the NMOS region, the NMOS metal gate stack structure including a first high dielectric layer, a first barrier metal gate on the first high dielectric layer, and a first metal gate on the first barrier metal gate, the first barrier metal gate including a first metal oxide nitride layer; and
   a PMOS metal gate stack structure on the PMOS region, the PMOS metal gate stack structure including a second high dielectric layer, a second barrier metal gate on the second high dielectric layer, and a second metal gate on the second barrier metal gate, the second barrier metal including a second metal oxide nitride layer;
   wherein the first metal oxide nitride layer includes a metal carbide oxide nitride layer, a metal silicide oxide nitride layer or a metal aluminum oxide nitride layer, and
   wherein the second metal oxide nitride layer includes a metal carbide oxide nitride layer, a metal silicide oxide nitride layer or a metal aluminum oxide nitride layer.

2. The CMOS device of claim 1, wherein the NMOS metal gate stack structure further includes a first metal interconnection layer on the first metal gate.

3. The CMOS device of claim 1, wherein the PMOS metal gate stack structure further includes a second metal interconnection layer on the second metal gate.

4. The CMOS device of claim 1, wherein the first barrier metal gate includes a lower barrier metal gate on the first high dielectric layer and an upper barrier metal gate on the lower barrier metal gate.

5. The CMOS device of claim 4, wherein the upper barrier metal gate includes the first metal oxide nitride layer.

6. The CMOS device of claim 1, wherein the second barrier metal gate includes a lower barrier metal gate on the second high dielectric layer and an upper barrier metal gate on the lower barrier metal gate.

7. The CMOS device of claim 6, wherein the upper barrier metal gate includes the second metal oxide nitride layer.

8. The CMOS device of claim 1, wherein the first metal gate and the second metal gate include different materials.

9. The CMOS device of claim 1, wherein the first and second metal oxide nitride layers include a same material.

10. The CMOS device of claim 1, wherein the first and second metal oxide nitride layers include different materials.

11. A complementary metal oxide semiconductor (CMOS) device, comprising:
- a semiconductor substrate including a NMOS region and a PMOS region;
- a NMOS metal gate stack structure in the NMOS region, the NMOS metal gate stack structure including a first high dielectric layer, a first barrier metal gate and a first metal gate, the first barrier metal gate including a first metal oxide nitride layer; and
- a PMOS metal gate stack structure in the PMOS region, the PMOS metal gate stack structure including a second high dielectric layer, a second barrier metal gate, a second metal gate, and a third metal gate including a third metal oxide nitride layer, the second barrier metal gate including a second metal oxide nitride layer
  - wherein the first metal oxide nitride layer includes a metal carbide oxide nitride layer, a metal silicide oxide nitride layer or a metal aluminum oxide nitride layer,
  - wherein the second metal oxide nitride layer includes a metal carbide oxide nitride layer, a metal silicide oxide nitride layer or a metal aluminum oxide nitride layer, and
  - wherein the third metal oxide nitride layer includes a metal carbide oxide nitride layer, a metal silicide oxide nitride layer or a metal aluminum oxide nitride layer.

12. The CMOS device of claim 11, wherein the first barrier metal gate includes a lower barrier metal gate on the first high dielectric layer, the lower barrier metal gate including a metal nitride layer, a metal silicon nitride layer or a metal aluminum nitride layer.

13. The CMOS device of claim 11, wherein the second barrier metal gate includes a lower barrier metal gate on the second high dielectric layer, the lower barrier metal gate including a metal nitride layer, a metal silicon nitride layer or a metal aluminum nitride layer.

14. A complementary metal oxide semiconductor (CMOS) device comprising:
- a semiconductor substrate including a NMOS region and a PMOS region;
- an insulating layer including a first trench and a second trench, the first and second trenches exposing the NMOS region and the PMOS region, respectively;
- a NMOS metal gate stack structure including a first high dielectric layer in the first trench, a first barrier metal gate on the first high dielectric layer, and a first metal gate on the first barrier metal gate, the first barrier metal gate including a first metal oxide nitride layer; and
- a PMOS metal gate stack structure including a second high dielectric layer in the second trench, a second barrier metal gate on the second high dielectric layer, a second metal gate on the second barrier metal gate, and a third metal gate on the second metal gate, the second barrier metal gate and the third metal gate including a second metal oxide nitride layer.

15. The CMOS device of claim 14, wherein the NMOS metal gate stack structure further includes a first metal interconnection layer on the first metal gate.

16. The CMOS device of claim 15, wherein the first metal interconnection layer is in the first trench and fills the first trench.

17. The CMOS device of claim 14, wherein the first barrier metal gate includes a first lower barrier metal gate on the first high dielectric layer and a first upper barrier metal gate on the first lower barrier metal gate, and the first trench exposes the first lower barrier metal gate.

18. The CMOS device of claim 17, wherein the second barrier metal gate includes a second lower barrier metal gate on the second high dielectric layer and a second upper barrier metal gate on the second lower barrier metal gate, and the second trench exposes the second lower barrier metal gate.

19. The CMOS device of claim 14, wherein the second barrier metal gate includes a lower barrier metal gate on the second high dielectric layer and an upper barrier metal gate on the lower barrier metal gate, and the second trench exposes the lower barrier metal gate.

* * * * *